United States Patent [19]

Poston et al.

[11] 4,346,480

[45] Aug. 24, 1982

[54] FREQUENCY IDENTIFICATION CIRCUIT

[75] Inventors: Billy R. Poston, St. Petersburg; Ramon P. Chambers, Clearwater; Robert S. Gordy, Largo, all of Fla.

[73] Assignee: E-Systems, Inc., Dallas, Tex.

[21] Appl. No.: 153,551

[22] Filed: May 5, 1980

Related U.S. Application Data

[63] Continuation of Ser. No. 910,943, Apr. 13, 1978, abandoned.

[51] Int. Cl.³ .................. H04B 1/16; H03K 5/22; G01R 23/16
[52] U.S. Cl. .................. 455/154; 307/522; 324/77 B; 324/77 G; 324/78 D; 328/138; 455/150
[58] Field of Search .................. 455/150, 154; 340/171 R; 324/77 B, 77 C, 77 G, 78 D, 79 D; 343/5 SA; 328/138, 140; 307/233 R, 522

[56] References Cited

U.S. PATENT DOCUMENTS

| 3,555,435 | 1/1971 | Vosteen | 328/140 |
| 3,961,261 | 6/1976 | Pflasterer | 325/470 |
| 4,057,756 | 11/1977 | Ley et al. | 324/78 D |
| 4,118,666 | 10/1978 | Bernstein | 307/233 R |

Primary Examiner—S. C. Buczinski

Attorney, Agent, or Firm—Robert V. Wilder; Albert M. Crowder, Jr.

[57] ABSTRACT

Frequency indication pulses are applied to comparison and feedback logic for the identification of a frequency in a selected frequency band. The comparison and feedback logic is part of an identification circuit that includes a main memory for storing representations of frequency values that is coupled to the comparison and feedback logic by data transfer gating. Control logic coupled to the data transfer gating and main memory provides shift pulses, clock pulses and control signals to sequence the operation of the main memory and comparison and feedback logic. Interval timing and control logic receives from the RF section of the compressive receiver a compare signal, a manual set signal and clock pulses to generate inhibit and enable signals for the comparison and feedback logic, and the control logic. When a comparison in the comparison and feedback logic between a received frequency indication pulse and a memory bit from the main memory indicates the presence of a new frequency, frequency value information, in the form of a sixteen bit data word, is transferred to interface logic and interface memory that encodes a digital word representing a specific frequency occurring within the time constrained subinterval. This digital word representation of a specific frequency is applied to an interface bus as frequency data available to the other sections of the compressive receiver.

24 Claims, 14 Drawing Figures

FREQUENCY IDENTIFICATION CIRCUIT

This is a continuation of application Ser. No. 910,943 filed Apr. 13, 1978, now abandoned.

This invention relates to a frequency identification circuit, and more particularly to a frequency identification circuit as a part of a compressive receiver for high speed identification of specific frequencies in a frequency band.

In a conventional compressive receiver a range of frequencies is swept and information relating to small, unique frequency intervals of the resulting spectrum must be resolved, stored, and updated within a relatively short time frame. The quantity of frequency information to be handled is typically in the tens of thousands range and the time frame to resolve, store and update spectrum information is typically twenty to thirty milliseconds. Heretofore, many techniques have been employed to sweep the frequency of a compressive receiver with many such techniques utilizing analog comparison for frequency identification. Such systems are inherently slow thereby reducing the potential number of frequency intervals that can be compared and placing a limit on the time spacing of the intervals.

In accordance with the present invention, frequency indications are digitally compared with a memory bit to identify the memory address corresponding to the identified frequency value. Such a digital technique significantly increases the number of frequency intervals that can be compared in the scan cycle and permits scanned subintervals to be less than several hundred nanoseconds in duration. A feature of the present invention is to provide a frequency identification circuit that is capable of accessing a large volume of frequency information within a short time interval. Another feature of the present invention is to provide a frequency identification circuit that synchronously compares stored frequency information with real time frequency indications by means of a digital comparison. Still another feature of the present invention is to provide a frequency identification circuit that generates a digital word, based upon the results of a digital comparison, representing a specific frequency occurring within a time constrained subinterval.

In a compressive receiver the frequency identification circuit of the present invention receives from the RF section frequency indication pulses, a manual set signal, a compare synchronization signal, and clock pulses. Also received by the frequency identification circuit over the interface bus of the receiver are device select and read signals. The frequency identification circuit of the present invention generates signals for use by other sections of the compressive receiver and other external devices over the interface bus. Output information from the frequency identification circuit includes an interrupt pulse, an inhibit pulse, and the frequency data all transmitted on the interface bus. In addition, the frequency identification circuit provides interval pulse signals to the RF section of the compressive receiver to switch frequency ranges and control comparison intervals.

In accordance with the present invention, a frequency identification circuit comprises storage means for retaining data relating to frequency value information and memory bits identified with each frequency value, the latter to be compared with an input frequency indication pulse. Both the input frequency indication pulse and the memory bit are applied to a comparator that generates an output when the input frequency indication pulse is recognized as a stored frequency value. The memory address of the identified frequency is encoded in response to the output of the comparison into a digital representation of an identified frequency. The bits of information and the frequency value data are transferred to and from various elements of the circuit by a transfer control.

The method of comparing an input frequency indication with stored frequency information bits in accordance with the present invention includes the steps of storing frequency indication information and associate memory bits. An input frequency indication pulse is loaded into a comparator along with a memory bit from the stored values. These bits are compared and when an input frequency indication pulse is identified with a stored frequency, address information is encoded into a digital representation of a specific frequency.

A more complete understanding of the invention and its advantages will be apparent from the following detailed description taken in conjunction with the accompany drawings.

Referring to the drawings.

Figure 1:
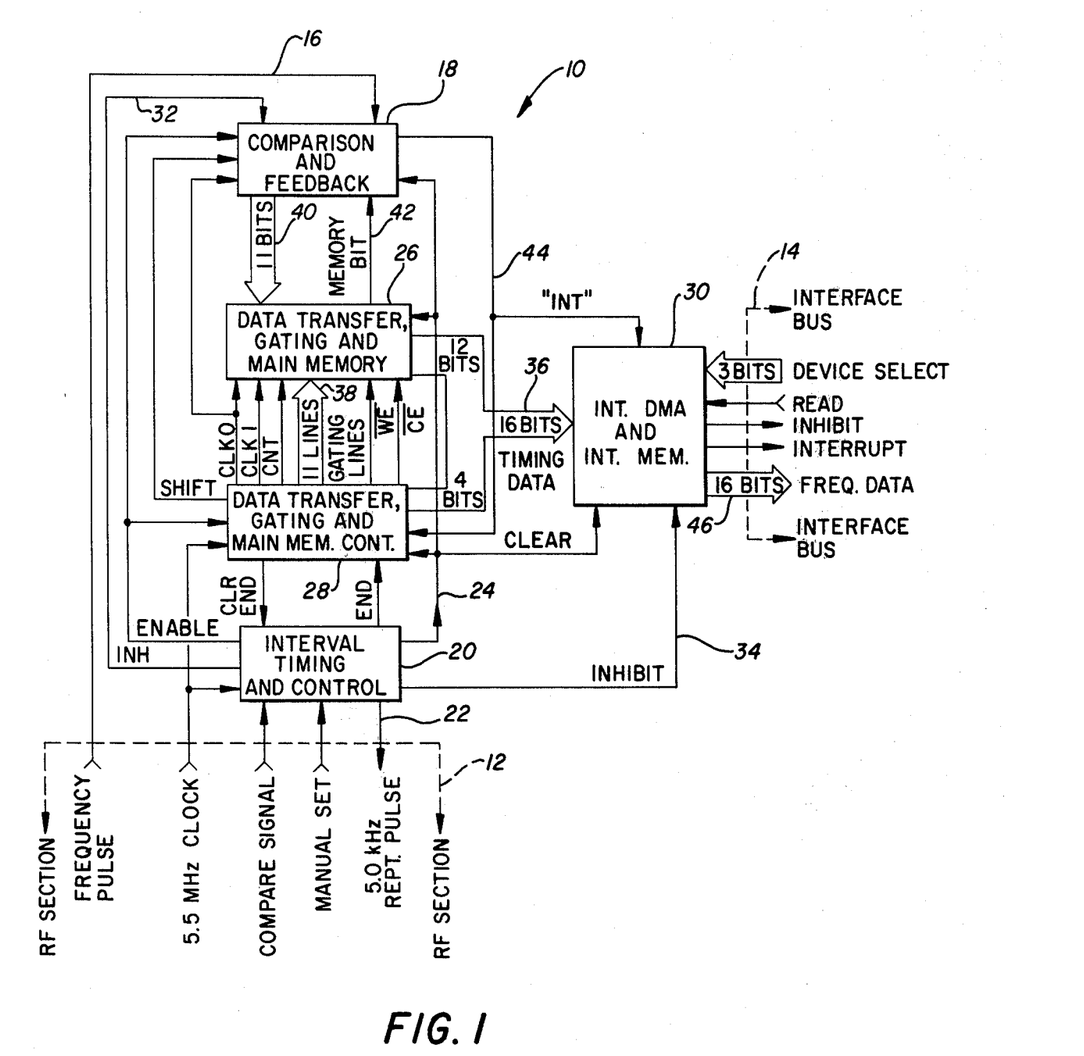
FIG. 1 is a block diagram of a frequency identification circuit coupled to the RF section and an interface bus of a compressive receiver.

Referring to FIG. 1, a frequency identification circuit 10 of a compressive receiver is connected to the RF section 12 of the receiver and to an interface bus 14. Input signals from the RF section include frequency indication pulse bits on a line 16 applied to comparison and feedback logic 18. Also input to the circuit 10 from the RF section 12 is a "manual set" signal and a "compare" signal applied to interval timing and control logic 20. The interval timing and control logic 20 also receives clock pulses from the RF section and provides repetitive interval pulses on a line 22 to the RF section to switch frequency ranges and control comparison intervals.

Functionally, the interval timing and control logic 20 generates master timing controls for use by each of the other logic modules for the identification circuit 10. One such control signal is a "clear" command on a line 24 applied to the comparison and feedback logic 18, and also applied to a data transfer gating and main memory 26, data transfer gating and main memory control logic 28 and interface DMA logic and interface memory 30. The clear command assures that all logic of the identification circuit 10 is initialized to the first interval of the sweep sequence. Another control signal generated by the control logic 20 is in "INH" signal applied to the comparison and feedback logic 18 on a line 32 and an "inhibit" signal applied to the interface DMA logic and interface memory 30 on a line 34. The "inhibit" command disables memory access to the interface DMA logic and interface memory 30 by an external device and the "INH" command sets the comparison and feedback logic 18 for a comparison function. Another output of the interval timing and control logic 20 is an enable signal on the line 32 to the comparison and feedback logic 18 and the memory control logic 28. This signal is the master enable for the system during valid comparison intervals. Another signal from the interval timing and control logic 20 is an "END" signal to the control logic 28 that functions to generate a "CLREND" command back to the control logic 20 that in turn generates a "clear" signal on the line 24 after information from and about the last frequency interval is obtained.

In addition to generating the "CLREND" signal to the interval timing and control logic 20, the data transfer gating and main memory control logic 28 generates the proper sequence of signals for the main memory 26, the comparison and feedback logic 18 and provides the four least significant bits (LSB) of frequency address information as an output over a data bus 36 to the interface DMA logic and interface memory 30. Additional signals output from the memory control logic 28 to the main memory 26 include clock pulses $CLK_0$ and $CLK_1$, the former also applied to the comparison and feedback logic 18. Other control signals output from the memory control logic 28 include a "CNT" command and control signals "WE" and "CE", all input to the main memory 26. Gating signals provided by the memory control logic 28 to the main memory 26 are coupled over gating lines 38.

In addition to gating signals on the lines 38, the data transfer gating and main memory 26 also receives address data over lines 40 from the comparison and feedback logic 18. The comparison and feedback logic 18 accepts a memory bit of frequency information from the memory 26 over a line 42. This memory bit of frequency information is compared with an input frequency indication bit, and generates an interrupt signal "INT", dependent upon the memory bit value and frequency indication on a line 44 to the memory control logic 28 and the interface DMA logic and interface memory 30. The interrupt signal sets the memory control logic 28 and the interface memory 30 for the transfer of frequency information bits from the memory control logic 28 and the main memory 26 over the data bus 36 to the interface memory 30. The comparison and feedback logic 18 also obtains the value of frequency indication occurring within a selected interval and transfers this frequency indication into the main memory 26 at the address determined by lines 40 so that current frequency information is retained.

Frequency value information transferred to the interface DMA logic and interface memory 30 from the memory control logic 28 and the main memory 26 is stored for later transfer to external devices at the proper timing sequence when a "read" command is input to the interface DMA logic 30 along with a "device select" signal. At this time, a digital representation of a frequency is applied to a data bus 46 as frequency data.

Referring to FIGS. 2–6, there is shown circuitry for implementation of the identification circuit 10 of FIG. 1. Timing and frequency data noted in the various figures represents values for one embodiment of the identification circuit of the present invention. With specific reference to FIG. 2, there is shown logic circuitry for generating interval timing and control signals with a 5.5 MHz clock received from the RF section of the compressive receiver and used to generate synchronization pulses. The 5.5 MHz clock is input to a divide-by-1100 divider 48 and also to a time delay network 50. Output pulses from the divide-by-1100 divider 48 occur every two hundred microseconds and are used as the repetitive 5 KHz interval pulses applied over the line 22 to the RF section 12. This signal is also input to a time delay network 52. Output signals from the delay networks 50 and 52 are input to AND gate logic including AND gates 54 and 56, respectively, each also receiving the "compare" signal from the RF section 12.

Figure 2:
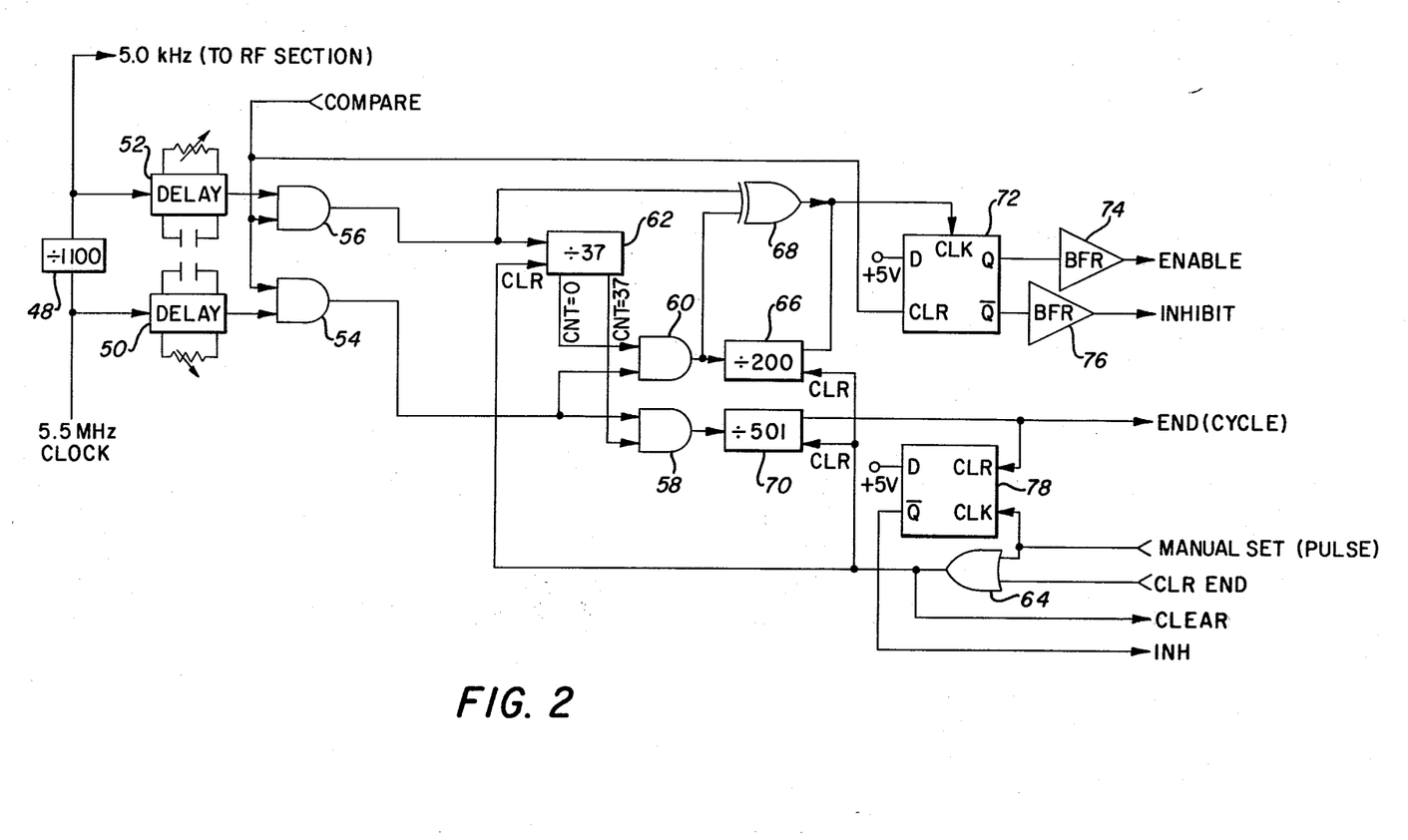
FIG. 2 is a schematic diagram of interval timing and control logic of the identification circuit of FIG. 1.

A timing signal from the AND gate 54 is applied to the inputs of AND gates 58 and 60. Also connected to each of the AND gates 58 and 60 is one of the outputs of a divide-by-37 divider 62 having one input connected to the output of the AND gate 56 and a second input connected to the "clear" signal at the output of an OR gate 64. The output of the OR gate 64 is the clear signal on the line 24 of FIG. 1.

An output of the AND gate 60 is applied to an input of a divide-by-200 divider 66 and also to one input of an exclusive OR gate 68 having a second input from the output of the AND gate 56. The output of the exclusive OR gate 68 and the output of the divider 66 are input as clock signals to a flip-flop 72 having a clear terminal connected to receive the "compare" signal from the RF section 12. At the Q-terminal of the flip-flop 72 there is connected a buffer amplifier 74 that generates the "enable" signal on line 32 to the comparison and feedback logic 18 and the memory control logic 28. Connected to the $\overline{Q}$-terminal of the flip-flop 72 is a buffer amplifier 76 that generates the "inhibit" signal to the comparison and feedback logic 18.

The output of the AND gate 58 is applied to a divide-by-501 divider 70 that generates the cycle END signal to the memory control logic 28. This cycle END signal is also applied to the clear terminal of a flip-flop 78 that is clocked by the "manual set" pulse from the RF section 12 connected to the clock terminal of the flip-flop. The "manual set" pulse from the RF section is also applied to one input of the OR gate 64. The $\overline{Q}$-terminal of the flip-flop 78 generates the "INH" signal to the comparison and feedback logic 18.

Digital timing for the circuit of FIG. 2 begins when the "compare" signal is received from the RF section 12. The compare signal enables the first, last and intermediate interval enable/inhibit signals. The "enable" signal is clocked after two hundred pulses of the first interval have occurred as controlled by the output of the exclusive OR gate 68 and the output of the divide-by-200 divider 66 clocking the flip-flop 72. The "enable" signal is reset when a "compare" signal applied to the clear terminal of the flip-flop 22 steps to logic low. All subsequent "enable" signals are clocked within a few nanoseconds of the appearance of the "compare" signal from the RF section 12 and are reset when the "compare" signal steps logic low. The last interval "compare" signal of a sweep cycle generates the "enable" signal as usual, however, the "END" signal appears after five hundred one (501) clock pulses have been applied to the divider 70 denoting that all frequency check points of the cycle have occurred. To initialize the internal timing and control logic the "CLREND" signal is applied to the OR gate 64 which generates the "clear" signal to the dividers 62, 66 and 70 which "clear" signal also appears on the line 24.

Since timing synchronizes the operation of the identification circuit 10 the internal timing and control logic of FIG. 2 is provided with adjustments for varying the delays of the networks 50 and 52. By adjustment of the variable delays for the networks 50 and 52, a fine synchronization adjustment is acheived. This configuration permits the generation of the "enable" signal at the proper timing during a sweep cycle.

Figure 3:
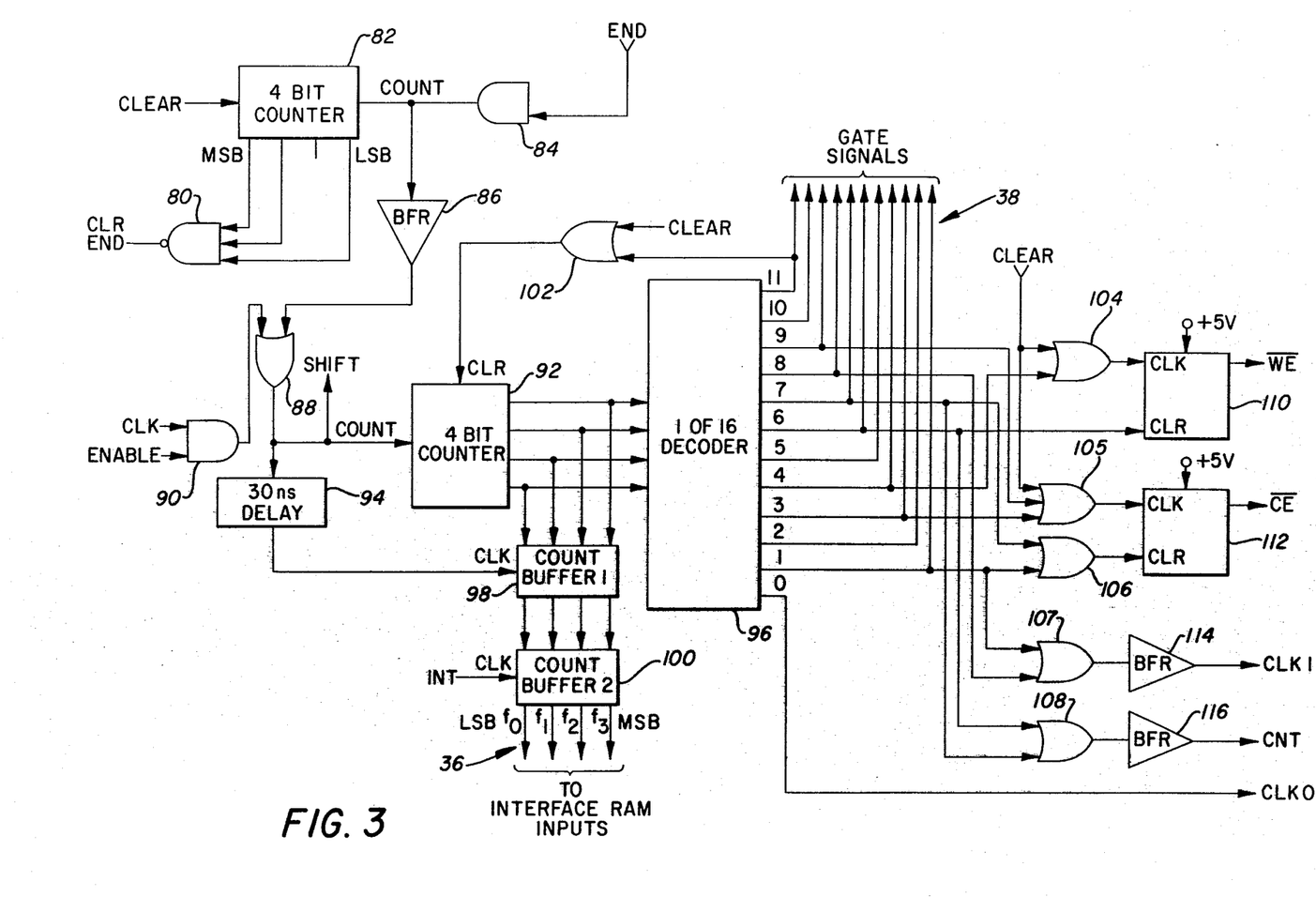
FIG. 3 is a schematic diagram of data transfer, gating and main memory control logic for the circuit of FIG. 1.

Referring to FIG. 3, there is shown a logic diagram of the memory control 28 that generates the "CLREND" signal to the OR gate 64 at the output of a NAND gate 80. The memory control 28 receives the "clear" signal from the OR gate 64 at the input of a four bit counter 82 that generates three outputs applied to three inputs of the NAND gate 80. Also connected to the four bit counter 82 is the output of an AND gate 84 receiving a timing signal from the output of the AND gate 56. The second input to the AND gate 84 is the "END" signal at the output of the divider 70.

Also connected to the output of the AND gate 84 is a buffer amplifier 86 generating an output applied to one input of an OR gate 88 having a second input from the output of an AND gate 90. The AND gate 90 receives the "enable" signal at one input and the 5.5 MHz clock from the RF section 12 at a second input. An output of the OR gate 88 is the "shift" signal applied to the comparison and feedback logic 18 and is also a count signal input to a four bit counter 92. The output of the OR gate 88 is also applied to a delay network 94.

The counter 92 provides four control lines which are applied to a one-of-sixteen decoder 96 and to a count buffer 98. The count buffer 98 is loaded by the output of the delay network 94. Outputs of the count buffer 98 are applied to a count buffer 100 that is clocked by the "INT" signal from the comparison and feedback logic 18. The output of the count buffer 100 is the four least significant bits of frequency value information applied over the data bus 36 to the interface portion of the logic 30.

Twelve gate signals are generated at the output of the one-of-sixteen decoder 96, eleven of which are directly connected to the main memory 26 over the gating lines 38. The twelfth signal from the decoder 96 is also applied to one input of an OR gate 102 that receives at a second input the "clear" signal from the OR gate 64 and generates a count clear signal to the four bit counter 92. The first output of the decoder 96 is the clock signal $CLK_0$ that is applied to both the main memory 24 and the comparison and feedback logic 18. Gating signals on lines 1-9 of the decoder 96 are applied to OR gate logic including gates 104-108. The gates 104 and 105 also receive the "clear" signal at the output of the OR gate 64. Connected to the output of the gate 104 is a flip-flop 110 that also receives the clear signal on the line 6 from the decoder 96. The output of the flip-flop 110 is the $\overline{WE}$ control applied to the main memory 26. Connected to the output of the gates 105 and 106 is a flip-flop 112 that generates the $\overline{CE}$ control to the main memory 26. Connected to the output of the gate 107 is a buffer amplifier 114 that generates the $CLK_1$ signal to the main memory 26. At the output of the gate 108 there is connected a buffer amplifier 116 that generates the CNT signal to the main memory 26.

As previously discussed, the logic of FIG. 3 representing the data transfer gating and main memory control 28 generates the proper sequence of signals for operation of the main memory, control and logic address and data information, and sequentially enables information to be compared with incoming frequency indication bits. This sequence of signals includes the outputs of the flip-flops 110 and 112 and the outputs of the buffer amplifiers 114 and 116 along with the gating signals from the decoder 96.

Figure 4:
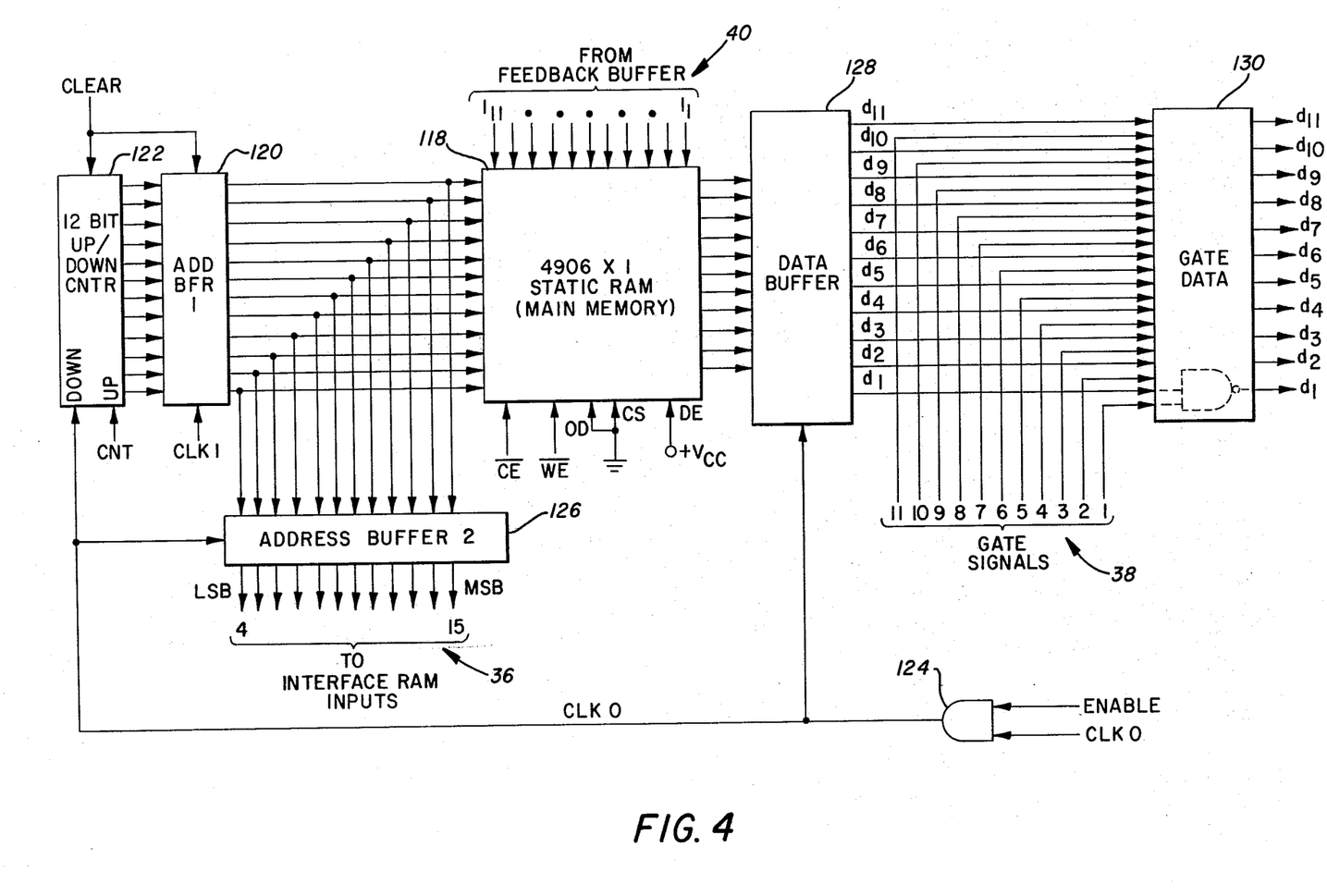
FIG. 4 is a schematic of data transfer, gating and main memory logic of the identification circuit.

Referring to FIG. 4, there is shown the logic of the data transfer gating and main memory 26 including a 4906 × 1 static random access memory 118. The random access memory (RAM) 118 is the main memory of the identification circuit 10. Control signals applied to the RAM 118 include the $\overline{CE}$ and $\overline{WE}$ sequencing commands from the control logic 28. Address data is applied to the RAM 118 through an address buffer 120 from a twelve bit up/down counter 122. Connected to the up/down counter 122 is the CNT signal from the control logic 28 and a clock signal at the output of an AND gate 124. Inputs to the AND gate 124 include the "enable" signal from the buffer amplifier 74 and the $CLK_0$ clock from the decoder 96. Connected to both the up/down counter 122 and the address buffer 120 is the "clear" signal at the output of the OR gate 64. Clocking of the address buffer 120 is sequenced by the $CLK_1$ signal from the output of the buffer amplifier 114.

Also connected to the address buffer 120 is an address buffer 126 that generates twelve bits of address information to the interface logic section of the interface logic and interface memory 30. These signals are applied from the address buffer 126 to the logic 30 over the data bus 36 and comprise the most significant bits of address information which will be combined with the least significant bits from the count buffer 100.

Frequency information data is fed into the RAM 118 over the data lines 40 from the comparison feedback logic 18. This information is stored as update frequency data for subsequent sweep cycles.

Frequency information stored in the RAM 118 is transferred to the interface memory 30 during an interrupt on the line 44. This data is transferred on an interval basis from the RAM 118 to a data buffer 128 and gated into the interface memory through a NAND gate array 130. The data is gated through the array 130 by gate signals from the control logic 28 over the gating lines 38. The frequency information is transferred from the main memory 26 to the interface memory 30 over the data bus 36.

Figure 5:
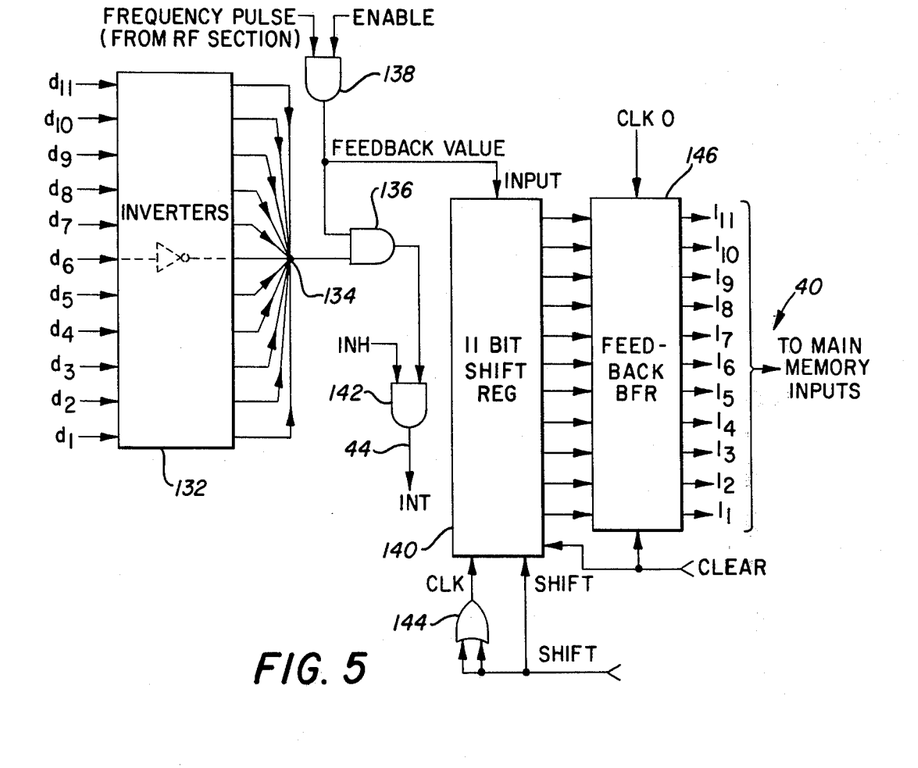
FIG. 5 is a schematic diagram of the comparison and feedback logic for the circuit of FIG. 1.

Referring to FIG. 5, a memory bit on one of the lines of the gate array 130 is applied to an inverter array 132 consisting of an inverter amplifier for each of the input lines. Each memory bit, $d_i$, is applied through an inverter to a summing junction 134 tied at one input of an AND gate 136. Each of the eleven inputs to the inverter array 132 represents a specific frequency stored in the RAM 118 for a discrete subinterval of a scan cycle. For each comparison a frequency indication will appear at only one of the eleven outputs from the inverter array 132. This output is compared in the AND gate 136 with an input frequency indication pulse from the RF section 12 applied to one input of an AND gate 138 having an output connected to the AND gate 136. A second input to the AND gate 138 is an "enable" signal from the buffer amplifier 74.

Whenever both inputs to the AND gate 136 are at the same logic level an output pulse is applied to one input of an AND gate 142 that receives a second input from the internal timing and control logic 20, that is, the "INH" signal from the $\overline{Q}$-terminal of the flip-flop 78. When both inputs to the AND gate 142 are at the same logic level the interrupt (INT) signal is generated on the line 44 to the count buffer 100 and to the interface logic and memory 30.

Also connected to the output of the AND gate 138 is the input of a shift register 140 that is clocked by the output of an OR gate 144 receiving the shift from the OR gate 88 of the memory control logic 28. This shift signal is also applied to the register 140 at a shift input for transferring feedback data serially into register 140 for loading into a feedback buffer 146. The feedback buffer 146 is clocked by an output from the decoder 96, that is, by the "$CLK_0$" signal. At the start of a sweep cycle the "clear" signal from the timing and control logic 20 is applied to both the shift register 140 and the feedback buffer 146. Data output from the feedback buffer 146 is applied over the data lines 40 to the RAM 118 of the main memory.

In operation, a single memory bit of frequency information is received from the inverter array 132 and this bit of information is compared with an input frequency indication pulse at the AND gate 136. When the INH signal is present at the AND gate 142 and a frequency comparison is made the interrupt signal is generated on the line 44 to the interface logic of the interface memory 30 and to the main memory control logic 28. This enables frequency information data from the buffers 100 and 126 to be transferred to the interface memory of the logic 30. The comparison feedback logic 18 also stores in the register 140 the frequency indication pulse input to the AND gate 138. This frequency indication pulse is stored in the shift register 140 for a predetermined indication subinterval, and for the logic shown this interval is eleven frequency indications. The values stored in the shift register 140 are shifted into the main memory RAM 118 after eleven cycles of the 5.5 MHz clock so that current frequency information is retained in memory.

Figure 6:
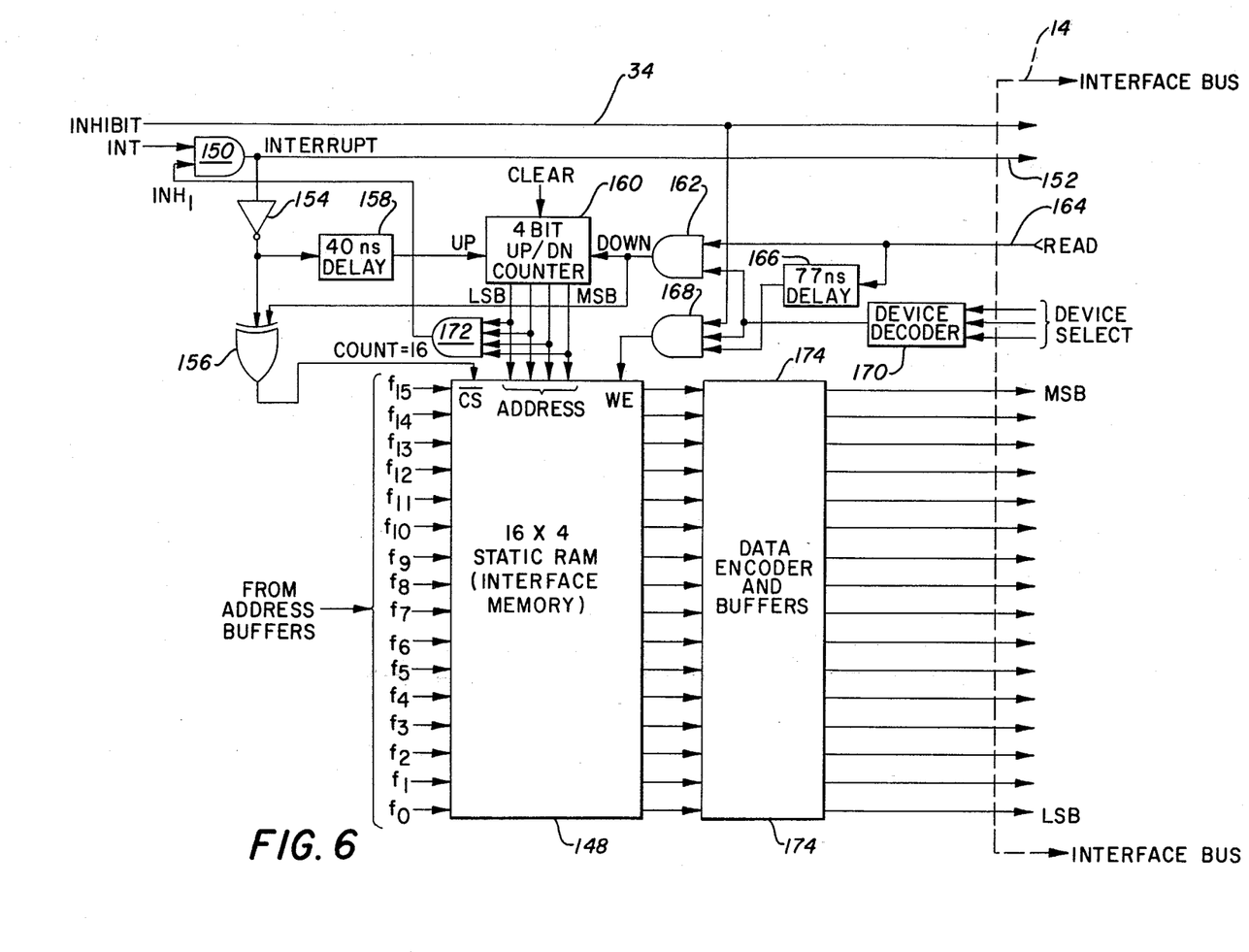
FIG. 6 is a schematic of the interface DMA logic and interface memory for the identification circuit of the present invention.

Referring to FIG. 6, frequency information data, in the form of a sixteen bit data word, is transferred to an interface memory 148 of the logic 30 from the buffers 100 and 126. This transfer takes place only upon the occurrence of the interrupt signal from the AND gate 142 as applied to an AND gate 150 having an output applied on a line 152 of the interface bus 14 and also the input of an inverter amplifier 154. The output of the inverter amplifier 154 is applied to one input of an exclusive OR gate 156 and also to a 40 nanosecond delay 158. Connected to the output of the delay 158 is a four bit up/down counter 160 that is also connected to the output of an AND gate 162. The output of the AND gate 162 is also applied to the second input of the exclusive OR gate 156. One input to the AND gate 162 is a "read" signal on a line 164 of the interface bus 14. The "read" signal on the line 164 is also applied to an input of a 77 nanosecond delay 166 that has an output connected to an input of an AND gate 168. A second input of the AND gate 168 is connected to the inhibit line 34 that also extends to the interface bus 14. A third input to the AND gate 168 and a second input to the AND gate 162 is the output of a device signal decoder 170 that receives a three bit code identifying a selected external device.

Connected to control terminals of the interface memory 148 is the output of the exclusive OR gate 156, the output of the AND gate 168, and an address code from the four bit up/down counter 160. This address code is also applied to an AND gate 172 having an output connected to the second input of the AND gate 150.

Frequency information applied to the interface memory 148 is parallel loaded into a sixteen by sixteen static random access memory (RAM). These stored values are then available to the external devices when the "inhibit" signal on the line 34 steps logic low and a "read" signal is received by the logic 30 over the line 164. Each time a "read" signal occurs on the line 164 and a device select code is applied to the decoder 170, frequency information stored in the interface memory 148 is transferred to a data encoder and buffer 174 and is then applied to the data lines 46. While a frequency information is being output on the data lines 46, the "read" signal on the line 164 is gated through the AND gate 162 to decrement the counter 160. This counter is incremented each time new frequency information is input to the interface memory 148 by the output of the 40 nanosecond delay 158.

Figure 7:
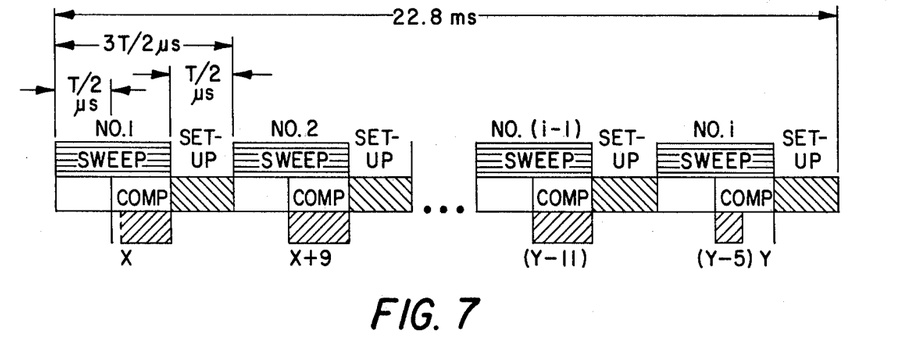
FIG. 7 illustrates a typical interval timing diagram for one sweep cycle of a compressive receiver.

In operation of the identification circuit 10, a frequency scan cycle, from X-MHz to Y-MHz, is evaluated for the occurrence of specific frequency values. A scan cycle is schematically represented in FIG. 7 and is composed of "i" subintervals. Within each subinterval "T" microseconds are designated for scanning a fixed frequency band of the scan cycle. Of the T microsecond portion of each subinterval a timing equal to T/2 microseconds is designated as the setup time for preparation for sweeping the next fixed frequency band in the subsequent subinterval. Due to possible overlapping frequency conditions, only one-half of the total time T microseconds sweep is used to generate usable frequency data. This is designated as the "compare" interval and a band of frequencies (B-MHz) is checked at each frequency point, each point separated by R-KHz and equally spaced across the band of frequencies. Thus, the band of frequencies is checked at (B/R) thousand unique frequency points. Thus, input frequency indication pulses are presented to the comparison and feedback logic 18 every RT/2B nanoseconds. Since each frequency indication represents the presence or absence of a specific frequency, each such specific frequency may be designated by a binary number.

To enable the checking of the presence or absence of a specific frequency in the scan cycle a fixed memory address location in the RAM 118 is designated for each of the frequencies to be checked. The state at each address, as transferred by means of a memory bit on the line 42 to the comparison and feedback logic 18, is an indication of the presence or absence of the corresponding frequency.

In one implementation of the identification circuit 10 of the present invention the RAM 118 was configured to have 11 by 4096 by 1 address locations to store frequency information. For this implementation the following data is pertinent:

T=400 seconds,
B=11 MHz,
R=10 KHz, and

I, the number of intervals in a scan cycle, =38 with the frequency span equal to 450 MHz. This enables the checking of the (B/R)K=1100 frequencies in any subinterval, and the total number of frequencies to be checked in the scan cycle of FIG. 7 equals 41,001 (including end points).

At the beginning of the scan cycle the identification circuit 10 is initialized by a "manual set" signal from the RF section 12 applied to the OR gate 64 and the clock input of the flip-flop 78. The "manual set" signal starts the frequency identification check by the comparison and feedback logic 18 and disables the interrupts by means of the "INH" signal applied to the AND gate 142. During the first scan cycle all interrupts are inhibited by the INH signal to the gate 142. All frequency indication pulses input to the comparison feedback logic 18 that appear during the first cycle after the "manual set" signal are transferred into the main memory RAM 118 to be available as comparison values for the next scan cycle.

At the completion of the first scan cycle the divide-by-501 divider 70 generates the "END" signal tha clears the flip-flops 78 thereby enabling the gate 142 and setting the comparison and feedback logic to generate interrupt signals. In addition to the "manual set" signal, the RF section 12 also generates the "compare" signal applied to the AND gates 54 and 56 and the clear terminal of the flip-flop 72. The "compare" signal synchronizes the row and column address of the main memory RAM 118 and enables the interval timing and control logic 20. For example, the "compare" signal occurs 200 microseconds after the beginning of each subinterval of the scan cycle since the first and last subintervals are usually not complete and this operation is provided by operation of the dividers 66 and 70.

Figure 8:
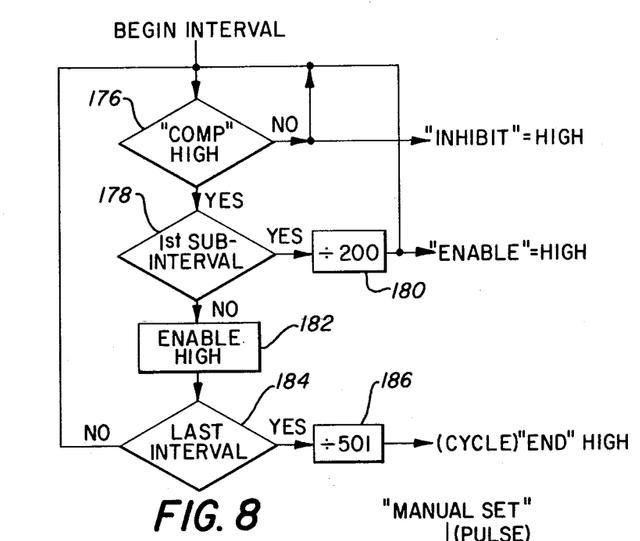
FIG. 8 is a flow chart of the operation of the interval timing for the logic of FIG. 2.

Referring to FIG. 8, there is shown a flow chart of the operation of the interval timing and control logic 20 for a scan cycle. The operation begins upon receipt of the "manual set" signal from the RF section 12. The first evaluation is made at an inquiry 176 to determine if the "compare" signal has been received from the RF section 12. Until the "compare" signal has been received, the "inhibit" signal is present at the output of the buffer 76 and the sequence cycles through the evaluation step 176 until a "compare" signal is applied to the logic 20 and the sequence advances to an evaluation step 178 to determine if the present subinterval is the first of a cycle. For the first subinterval of a cycle a step 180 is completed which enables the operation of the divide-by-200 divider 66 to clock the flip-flop 72 at the end of 200 clock pulses to generate the "enable" signal on the line 32 to the comparison and feedback logic 18 and to the main memory control logic 28. The sequence recycles through the evaluation steps 176 and 178 and for the second subinterval the "enable" signal is set by clocking the flip-flop 72 from the output of the exclusive OR gate 68 at a processing step 182. The operation of the interval timing and control logic 20 continues through an evaluation step 184 and recycles to steps 176, 178, 182 and 184 until the last subinterval of a scan cycle. The sequence then advances to a step 186 which is representative of the operation of the divide-by-501 divider 70 to generate the cycle end signal to the AND gate 84 of the memory control logic 28.

Figure 9:
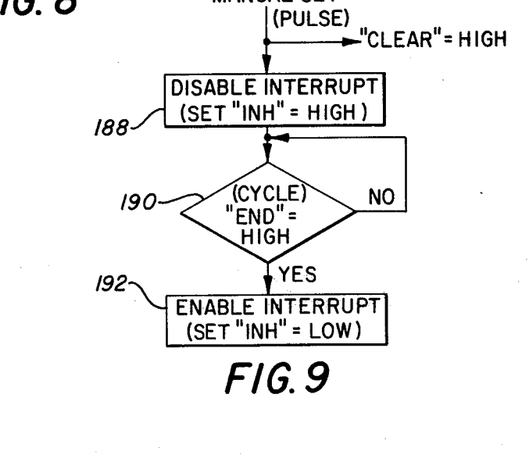
FIG. 9 is a flow chart of the manual set procedure for the interval timing control logic of FIG. 2.

Referring to FIG. 9, there is shown a flow chart of another operation of the interval timing and control logic 20 upon receiving a "manual set" signal from the RF section 12. As mentioned, the manual set signal applied to the OR gate 64 generates the "clear" signal on the line 24 to initialize the logic of the identification circuit 10. Upon receipt of the "manual set" signal the disable interrupt "INH" is set in a step 188 and applied to the AND gate 142. The disable interrupt is maintained throughout the evaluation step 190 until the "cycle end" signal is generated at the output of the divider 70 which advances the sequence to a step 192. Step 192 represents the operation of the divide-by-501 divider 70 to clear the flip-flop 78 removing the disable interrupt from the gate 142 and generate the enable signal at the output of the buffer amplifier 74 as applied over the line 32 to the main memory control logic 28 and the comparison and feedback logic 18.

After a cycle has been initialized, control signals necessary to sequence memory transfers and enable data comparison must be generated in addition to the cycle and interval timing signals. The data transfer gating and main memory control logic 28 of FIG. 3 generates the control signals.

When the clear signal is generated at the output of the OR gate 64 upon receipt of the "manual set" signal an eleven bit word located at memory address $\phi$ in the main memory RAM 118 (representing frequency information X-MHz to [X-MHz+100 KHz]) is available at the output of the main memory and applied to the input of the data buffer 128. The "enable" signal is generated at the output of the buffer amplifier 74 and a few nanoseconds later the decoder 96 generates the $CLK_0$ signal which along with the "enable" signal is applied to the gate 124. Applying these two signals to the gate 124 gates the eleven bit word at the output of the main memory RAM 118 into the buffer 128, gates the main memory address into the buffer 126 and decrements the main memory address in the buffer 120 through the up/down counter 122. Another sequence activated by generating the $CLK_0$ signal at the output of the decoder 96 is to gate data in the shift register of the comparison and feedback logic 18 into the feedback buffer 146.

Figure 10:
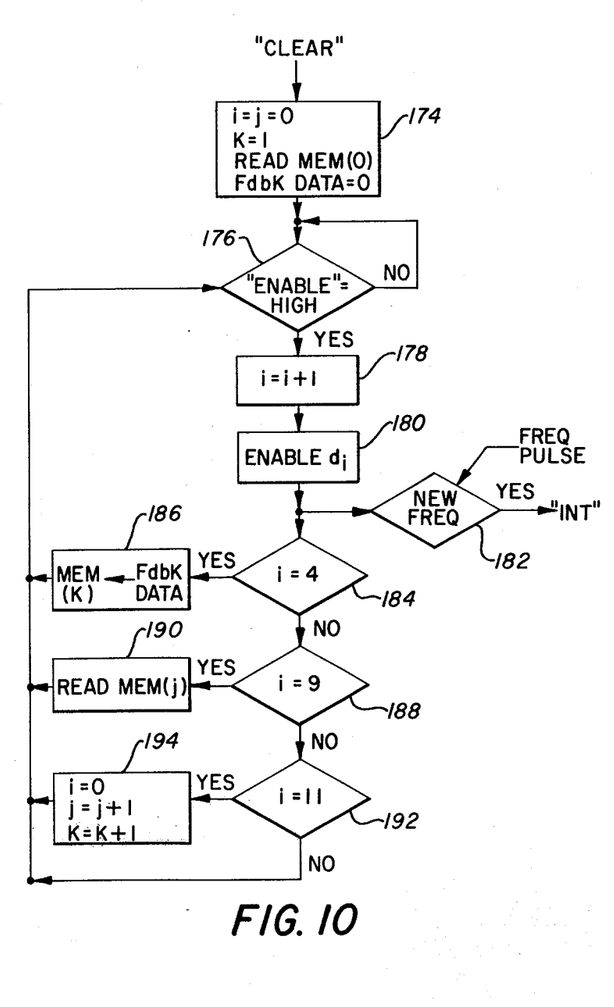
FIG. 10 is a flow chart for data transferring, gating, main memory control, frequency comparison and feedback operation.

Referring to FIG. 10, there is shown a flow chart for data transfer, gating, main memory, frequency comparison and feedback operation as sequenced by operation of control signals from the interval timing and control logic 20. Operation step 174 is initialized upon receipt of a "clear" signal from the interval timing and control logic 20 and steps the sequence to an evaluation step 176 which cycles until the "enable" signal at the output of the buffer amplifier 74 is generated. After the initial gating is completed as previously described, control pulses, at a repetition rate of 1/5.5 MHz, are generated at the output of the counter 92 and applied to the decoder 96. Each clock pulse generates a gate signal at the output of the decoder 96 that is applied to the gate array 130.

The sequence for generating the gating signal by the decoder 96 is shown by the step 178 of FIG. 10. Each gate signal enables a corresponding gate in the gate array 130 as represented by the step 180 to transfer a corresponding data bit from the buffer 128 into the inverter array 132 of the comparison and feedback logic 18.

Since the enable signal has already been generated at the output of the buffer amplifier 74, the gate 138 (see FIG. 5) is enabled thereby allowing a comparison of the gated data with the input frequency indication pulses. This evaluation of input frequency data pulses is represented by the evaluation step 182 and when a comparison results an interrupt signal is generated on the line 44 at the output of the gate 142. This operation allows the first eleven bits, or first word, transferred from the main memory 118 into the data buffer 128 to be compared on a one-to-one basis with the first eleven frequencies of a scan cycle. Each successive word stored in the main memory RAM 118 is similarly transferred into the data buffer 128 and gated through the array 130 by gate signals from the decoder 96 to be compared on a one-to-one basis with the eleven frequencies of a subinterval of the scan cycle of FIG. 7.

As mentioned, each input frequency indication pulse is stored in the shift register 140 for subsequent transfer to the main memory RAM 118. This stored information is clocked through the feedback buffer 146 into address locations at the main memory RAM 118. In general, feedback information relating to the j-th column of the main memory is written into the j-th word of the memory on the (j+1)th comparison cycle.

Due to the long access time of the memory, each write cycle begins when the fourth frequency comparison of each eleven comparison subinterval is initiated as determined by the evaluation step 184. When the fourth frequency comparison occurs the step 186 is completed to generate a write address for the feedback data. The sequence of FIG. 10 continues and on the ninth frequency comparison an evaluation step 188 advances the sequence to a read memory step 190 which initiates a memory read cycle by generating a read address. The comparison of individual frequencies continues sequencing the system operation to the evaluation step 192 until completion of eleven frequency comparisons at which time the sequence advances to a step 194 that sets the data enable address to zero, and increments the write address and read address by one. The sequence of FIG. 10 continues for the complete scan cycle of FIG. 7.

Figure 11:
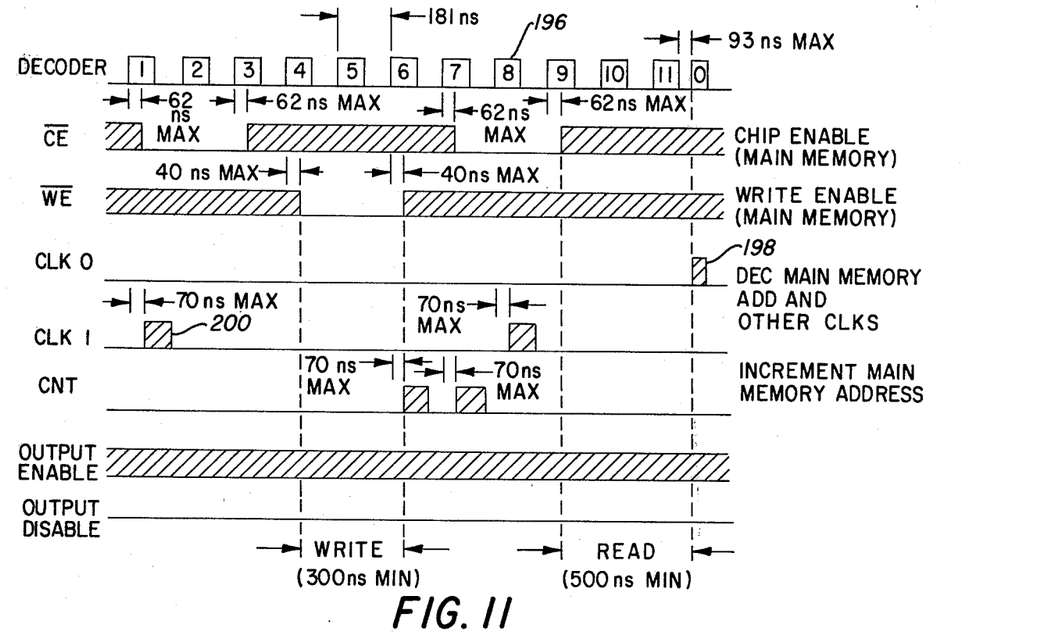
FIG. 11 is a timing diagram for the interface DMA logic and interface memory of FIG. 6.

Referring to FIG. 11, operation of the identification circuit 10 requires sequencing of the various logic elements and this sequential timing is controlled by signals generated at the outputs of the memory control logic 28. With reference to FIGS. 3 and 4, initially the counters 92 and 122 and the address buffer 120 are cleared before the "enable" signal is generated at the output of the buffer amplifier 74. As illustrated by the shaded areas of FIG. 11, the main memory address access signals $\overline{WE}$ and $\overline{CE}$ are at a logic high and the read operation as described with reference to FIG. 10 has occurred, which implies that data in the main memory RAM 118 is available at the data buffer 128. The pulse train output of the decoder 96 is illustrated by the waveform 196 with each of the various pulses containing a number to indicate a gate signal. When the decoder 96 is in state "0", the clock signal $CLK_0$ is logic high as indicated by the pulse 198. When the enable output goes logic high at the output of the buffer amplifier 74, data at the main memory address "0" is clocked into the data buffer 128, the address buffer 126 is loaded with the read address from the buffer 120 and the twelve up-/down counter 122 is decremented. The 5.5 MHz clock is also enabled when the "enable" signal steps to logic high.

The state of the four bit counter 92 is now incremented to state "one", and after the outputs have settled the counter information is clocked into the count buffer 98. The value in the count buffer 98 is the new row address of the main memory RAM 118 in the event an interrupt occurs as a result of a comparison in the AND gate 136. The decoder 96 is in state "one", as illustrated by the waveform 196, and the clock signal $CLK_1$ steps to a logic high, as indicated by the pulse 200. At this time the main memory access pulse $\overline{CE}$ steps to a logic low and a write address (equal to the read address minus one) is clocked into the address buffer 120. When the decoder 96 is in state "one", a frequency memory bit in the data buffer 128 is shifted through the gate array 130 into the inverter array 132 of the comparison and feedback logic 18.

At the occurrence of the next clock pulses of the 5.5 MHz clock, the four bit counter 92 is incremented thereby also incrementing the decoder 96. At this time, the count value in the four bit counter 92 is clocked into the count buffer 98 and the next frequency memory bit in the data buffer 128 is transferred through the gate array 130 into the inverter array 132. Throughout this operation the "shift" signal is generated at the output of the OR gate 88 and input to the shift register 140 of the comparison and feedback logic 18. Each time another pulse is shifted into the inverter array 132 a comparison is made with an input frequency indication bit in the AND gate 136. This comparison proceeds as previously explained.

Each time a pulse is received from the 5.5 MHz clock the above operation repeats stepping the decoder 96 to the next state. As illustrated in FIG. 11, each state is 181 nanoseconds in time duration thereby allowing this amount of time for each comparison of an input frequency indication bit.

As illustrated in FIG. 11, additional signals are required to sequence the operation of the identification circuit 10. When the decoder 96 steps to state "three" the memory access signal $\overline{CE}$ goes logic high and a memory read begins. This operation is disabled on receipt of the next clock pulse and a main memory write begins and feedback information from the feedback buffer 146 is written into the main memory RAM 118 during the next two states of the decoder 96.

With reference to FIG. 10, this operation is shown by the evaluation step 184 and the step 186. When the decoder 96 enters states "six" and "seven" the twelve bit up/down counter 122 is incremented, once for each state, in order to obtain the proper value for a read address. This value is clocked into the address buffer 120 when the decoder 96 steps to state "eight". As illustrated in FIG. 10 by the evaluation step 188 and the step 190, when the decoder 96 steps to state "nine" the next eleven frequency check points from the main memory RAM 118 are available for reading. This data will be clocked into the data buffer 128 when the decoder next steps to state "zero".

As illustrated by the interconnection of the decoder 96 to the OR gate 102, when the decoder steps to state "eleven", the four bit counter 92 is reset for the next eleven pulse intervals.

The above operation continues sequentially transferring eleven frequency check points from the main memory RAM 118 into the data buffer 128 and then gating these check points individually through the gate array 130 into the inverter array 132 for comparison with individual input frequency indication bits applied from the RF section 12 to one input of the AND gate 138. The comparison takes place only during the compare interval as illustrated in FIG. 7 of one of the subintervals of the scan cycle.

The last frequency check point of a scan cycle occurs when the fourth data bit of the 3227th word of the main memory RAM 118 is transferred through the gate array 130 into the inverter array 132. At this time it is necessary to complete one and one-half memory cycles in order to write all data in the feedback buffer 146 into the main memory RAM 118. Thus, when the cycle "end" signal goes logic high at the output of the divider 70, a thirteen pulse extended DMA (direct memory access) is enabled. To enable the DMA the 5.5 MHz clock is gated with the internal clock at the OR gate 88 to pulse the four bit counter 92. When the cycle "end" signal steps to logic high the decoder 96 is in state four and thirteen extra count pulses are required. During state four of the decoder 96 the feedback data for the 3726th word is being written into the main memory RAM 118. Therefore, to write feedback data into the 3727th memory word location and to complete a cycle thirteen additional clock pulses are required.

Frequency memory bits gated from the data buffer 128 are compared with input frequency pulse data from the RF section in the AND gate 136, as explained. An interrupt signal (INT) is generated and applied to the AND gate 150 of the interface DMA interface and memory logic 30. As configured in the embodiment disclosed, an interrupt signal will occur only if the memory bit from the data buffer 128 is logic zero and the input frequency pulse from the RF section is logic high. The interrupt signal gates a sixteen bit row and column address of the main memory RAM 118 into the interface DMA logic 30 over the data bus 36. A write sequence follows and the row and column address from the main memory RAM 118 is written into a memory location of an interface memory 148 as specified by the output of the four bit up/down counter 160.

Figure 12:
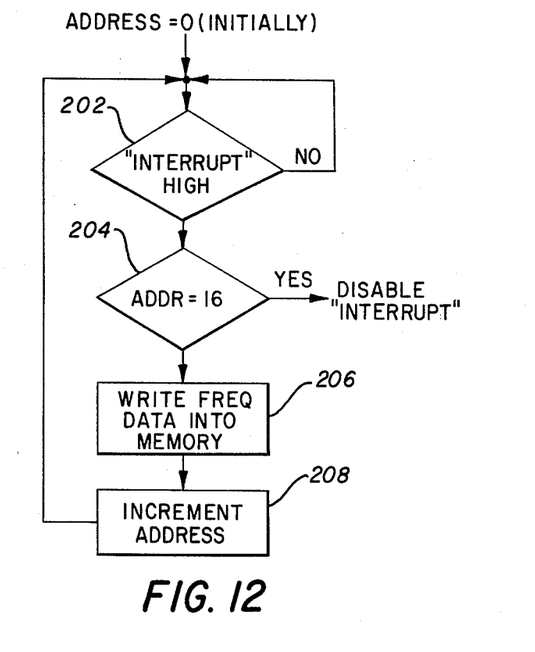
FIG. 12 is a flow chart of the operation of the interface DMA logic of FIG. 6 for providing a frequency value data to the interface memory.

Referring to FIG. 12, there is shown a flow chart illustrating the sequence of operation with the address in the up/down counter 160 initially set at zero. An evaluation step 202 is made and recycled until an interrupt signal occurs which advances the sequence to an evaluation step 204 as a check of the address location of the up/down counter 160. If the counter address is less than sixteen, this number is preset, the frequency data is written into the interface memory 148 from the main memory RAM 118 in a sequence step 206. The address in the up/down counter 60 is incremented in the sequence step 208 and this portion of the operation of the DMA logic 30 recycles back to the evaluation step 202 until an interrupt occurs.

When the address of the up/down counter 160 steps to sixteen the maximum number of frequency data words is stored in the interface memory 148 and the output of the AND gate 172 disables the AND gate 158 thereby blocking out any further interrupt signals from the comparison and feedback logic 18 until the counter 160 is decremented below the sixteen value.

Figure 13:
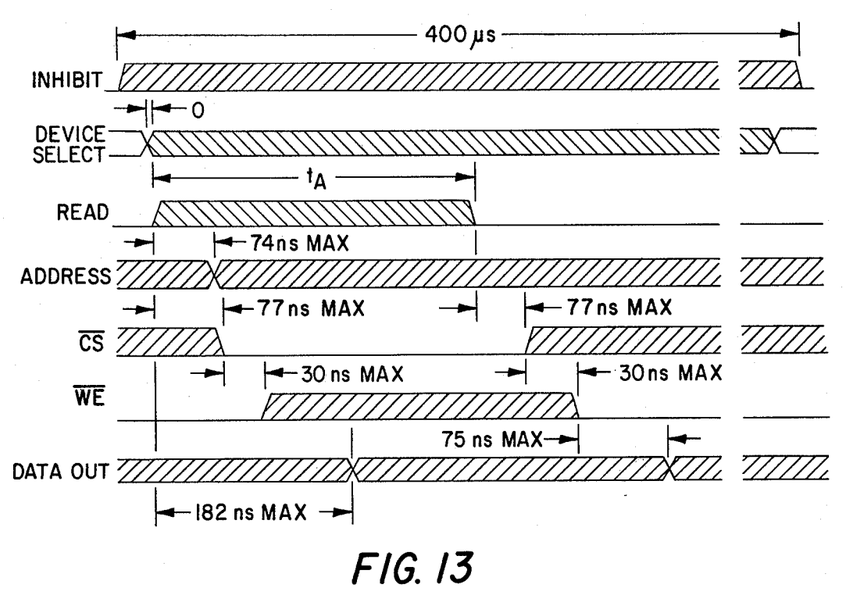
FIG. 13 is a timing diagram of the operation of the interface logic of FIG. 6 in response to a read command.

Referring to FIG. 13, there is shown a timing diagram illustrating the sequence of operation of the interface DMA and interface memory logic 30. Interrupt signals from the comparison feedback logic 18 for loading the interface memory 148 can only occur during compare intervals of a timing cycle such as shown in FIG. 7. During a compare interval the inhibit signal at the output of the buffer amplifier 76 is logic low and is thus an indication that an external device connected to the interface bus 14 cannot read frequency data from the interface memory 148.

When a new frequency occurs at the RF section and is identified by a comparison at the AND gate 136 the interrupt signal "INT" goes logic high and, assuming less than sixteen frequencies stored in the interface memory 148, the interface DMA logic and interface memory are enabled. The interrupt signal INT as applied to the AND gate 150 generates an "interrupt" signal which is a pulse sent to external devices over the line 152 and also to the inverter amplifier 154 of the DMA write control logic. The pulse output of the AND gate 150 causes the interface memory access pulse $\overline{CS}$ to step logic low, which, in turn, causes the row and column main memory address RAM 118 to be written into the interface memory 148 at an address location determined by the output of the four bit up/down counter 160. Typically, the write access time of a sixteen-by-sixteen static random access memory, such as used to implement the interface memory 148, is typically 50 nanoseconds. Therefore, the address counter 160 is not incremented until after the frequency data has been written into the interface memory 148.

For an external device to read frequency data from the interface memory 148, the following sequence of signals must be present: the inhibit signal on line 34 must be at a logic high level; a three bit "device select" code must be present on the interface bus 14; and a "read" signal must be logic high as received from an external device.

When the read signal goes to a logic high the up/down counter 160 is decremented and it stores the address of the interface memory from which frequency data will be read. Data relating to the frequency at the address of the up/down counter 160 is transferred to the encoder/buffer 174 and is placed on the data bus 46. Thus with reference to FIG. 13, to read data from the interface memory 148, each of the signals there represented will be at a logic high with the exception of the interface memory access pulse $\overline{CS}$ which must be at a logic low.

Figure 14:
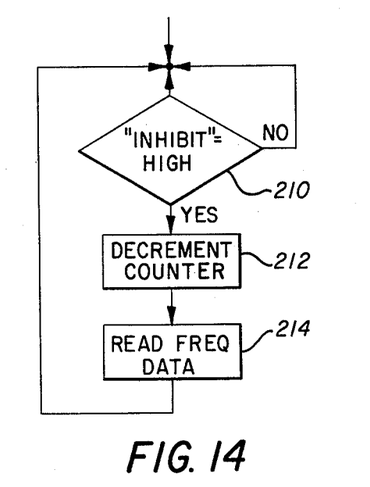
FIG. 14 is a flow chart of the operation of the interface logic of FIG. 6 in response to a read signal from an external device.

Referring to FIG. 14, there is shown a flow chart of the operation of the interface DMA logic and interface memory 30 to read data from the interface memory 148. Initially the read sequence is entered at the evaluation step 210 to determine if the inhibit signal from the buffer amplifier 76 is logic high. Until this signal steps to logic high the sequence recycles to the evaluation step 210. When the inhibit signal steps to logic high the up/down counter 160 is decremented in a step 212 and when the appropriate sequence of signals is present data is read from the interface memory during a step 214. After reading frequency data at one address from the interface memory 148, the sequence returns to the evaluation step 210. Note, that as shown in FIG. 13 the inhibit signal remains at the logic high level for 400 microseconds of each 600 microsecond sweep interval. Thus, the inhibit signal remains at a logic high level for sixty-six percent of the entire sweep cycle as shown in FIG. 7.

In the embodiment of the invention described, the address from the main memory RAM 118 (twelve bits of information together with the four bits of address information from the counter 100 will uniquely define $2^{16} = 65,536$ frequency values. Thus, the identification circuit 10 as illustrated and described will uniquely identify and compare 65,536 frequency indications occurring (approximately) 181 nanoseconds apart. It should be noted that the interface logic 30 is configured to supply information, with no loss in accuracy, for fifteen new frequencies during each subinterval of a scan cycle. If an external device reads these fifteen values within the 400 microsecond interval allowed, the total capability of the system then becomes equal to 570 new frequencies per cycle, assuming 38 subintervals in a scan cycle.

While only one embodiment of the invention, together with modifications thereof, has been described in detail herein and shown in the accompanying drawings, it will be apparent that various further modifications are possible without departing from the scope of the invention.

What is claimed is:

1. A frequency identification circuit for identifying the presence of a frequency in a band of frequencies, comprising:
   means for storing at address locations individual frequency information data for the band of frequencies and for generating a memory bit identifying the address location of each of the individual frequencies,
   means for comparing a memory bit for an identified individual frequency with a frequency information bit representing the presence of a frequency in the band of frequencies and for generating an indication signal when a comparison occurs thereby indicating the presence of a frequency at the memory bit address in the means for storing, and
   encoding means connected to said means for storing and responsive to the indication signal to receive from the means for storing the frequency information data at the address location identified by the memory bit compared with the frequency information bit for encoding into a digital representation of the identified frequency.

2. A frequency identification circuit as set forth in claim 1 including means for generating a timing sequence for transferring the frequency information data from said means for storing to said means for comparing.

3. A frequency identification circuit as set forth in claim 1 wherein said means for encoding includes memory means for storing an encoded output.

4. A frequency identification circuit as set forth in claim 1 including means for generating a transfer signal to said means for storing when a comparison indicates the existence of a frequency for encoding by said encoding means.

5. A frequency identification circuit as set forth in claim 1 including timing and control logic for generating master timing signals to each of said means.

6. A frequency identification circuit as set forth in claim 1 wherein said encoding means includes interface logic connected to said encoding means for providing access to the digital representations of the identified frequencies.

7. A frequency identification circuit for a compressive receiver, the circuit identifying the presence of a frequency in a band of frequencies, comprising:
   means for storing at address locations individual frequency information data for the band of frequencies of the compressive receiver and for generating a memory bit identifying the address location of each of the individual frequencies,
   means for comparing a memory bit for an identified individual frequency with a frequency information bit representing the presence of a frequency in the band of frequencies from the RF section of the compressive receiver and for generating an indication signal when a comparison occurs thereby indicating the presence of a frequency at the memory bit address in the means for storing,
   data transfer and control logic for generating clock and control signals to control the transfer of data to and from said means for storing and said means for comparing, and
   interface logic and memory means connected to said means for storing and responsive to the indication signal to receive from the means for storing the frequency information data at the address location identified by the memory bit compared with the frequency information bit from the RF section for encoding and storing a digital representation of the identified frequency.

8. A frequency identification circuit for a compressive receiver as set forth in claim 7 including interval timing and control logic for generating master timing control for each of said means.

9. A frequency identification circuit for a compressive receiver as set forth in claim 7 wherein said means for comparison includes storing means for retaining the values of frequency indications occurring within an indication interval.

10. A frequency identification circuit for a compressive receiver as set forth in claim 9 wherein said means for comparing includes feedback logic responsive to a sequence signal from said data transfer and control logic to transfer the stored values of frequency indication into said means for storing.

11. A frequency identification circuit for a compressive receiver as set forth in claim 8 wherein said interval timing and control logic generates an inhibit signal to said means for comparing during an initial cycle for storing in said means for storing the data related to individual frequencies.

12. A frequency identification circuit for a compressive receiver as set forth in claim 7 wherein said interface logic includes a random access memory for receiving frequency information data from said means for storing when said means for comparing generates an indication signal.

13. A method of identifying the presence of an input frequency in a band of frequencies from stored frequency information data representing the band of frequencies, comprising the steps of:
   storing at address locations individual frequency information data for the band of frequencies,
   generating a memory bit identifying the address location of each of the individual frequencies,
   comparing a memory bit for an identified individual frequency with a frequency information bit representing the presence of an input frequency in the band of frequencies,
   generating an indication signal when a comparison occurs thereby indicating the presence of a frequency at the memory bit address,
   transferring in response to the indication signal information data at the address location identified by the memory bit compared with the frequency information bit, and
   encoding the information data into a digital representation of an identified frequency.

14. The method of identifying an input frequency indication from stored frequency information data as set forth in claim 13 including the step of storing input frequency data occurring within an indication interval.

15. The method of identifying an input frequency indication from stored frequency information data as set forth in claim 14 including the step of transferring the stored input frequency data into a main memory.

16. The method of identifying an input frequency indication from stored frequency information data as set forth in claim 13 including the step of generating a digital word based on the results of the step of comparing, the digital word representing a specific frequency occurring within a time constrained interval.

17. The method of identifying an input frequency indication from stored frequency information data as set forth in claim 13 including the step of synchronizing in real time the comparison of the input frequency information bit with the memory bit.

18. The method of identifying an input frequency indication from stored frequency information data as set forth in claim 13 including the step of timing the comparing step to occur within a subinterval of a frequency scan cycle.

19. The method of identifying an input frequency indication from stored frequency information data as set forth in claim 13 including the step of inhibiting a comparison during an initial scan cycle for loading frequency information data into storage.

20. The method of identifying an input frequency indication from stored frequency information data as set forth in claim 13 including the step of reading the digital encoded data of a frequency representation for transfer to an external circuit.

21. The method of identifying an input frequency indication from stored frequency information data as set forth in claim 20 including the step of decrementing the number of stored digital representations when the step of reading the digital data transfers a frequency representation to an external device.

22. The method of identifying an input frequency indication from stored frequency information data as set forth in claim 13 including the step of inhibiting additional encoding of frequency data whenever a predetermined number of previous values have been encoded and stored.

23. The method of identifying an input frequency indication from stored frequency information data as set forth in claim 13 including the step of enabling the step of comparing after a preset time into a first interval of a scan cycle.

24. The method of identifying an input frequency indication from stored frequency information data as set forth in claim 23 including the step of disabling the comparison step at a preset time into the last interval of a scan cycle.

* * * * *